United States Patent
Kappes et al.

(10) Patent No.: US 7,787,527 B2
(45) Date of Patent: Aug. 31, 2010

(54) PRECISE DYNAMIC HYSTERESIS

(75) Inventors: Michael S. Kappes, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 959 days.

(21) Appl. No.: 11/246,940

(22) Filed: Oct. 7, 2005

(65) Prior Publication Data

US 2007/0064779 A1   Mar. 22, 2007

Related U.S. Application Data

(60) Provisional application No. 60/718,543, filed on Sep. 19, 2005.

(51) Int. Cl.
   *H04B 1/38* (2006.01)
   *H04L 5/16* (2006.01)

(52) U.S. Cl. .................................. 375/219; 327/205

(58) Field of Classification Search .............. 375/219; 327/205
   See application file for complete search history.

(56) References Cited

U.S. PATENT DOCUMENTS

| | | | |
|---|---|---|---|
| 6,522,160 B1 * | 2/2003 | Zivanovic | 324/765 |
| 7,233,645 B2 * | 6/2007 | Feda | 378/102 |
| 2003/0081461 A1 * | 5/2003 | Yamauchi et al. | 365/189.09 |
| 2004/0242175 A1 * | 12/2004 | Lin | 455/147 |
| 2005/0050370 A1 * | 3/2005 | Vyssotski et al. | 713/300 |

* cited by examiner

*Primary Examiner*—David C Payne
*Assistant Examiner*—Tanmay K Shah
(74) *Attorney, Agent, or Firm*—Garlick Harrison & Markison; James A. Harrison

(57) ABSTRACT

An analog comparator circuit with associated hysteresis logic operably disposed to provide a logic switching mechanism based upon an input voltage level includes a voltage comparator block operably disposed to receive a voltage input signal at a positive terminal of the voltage comparator block and a selected reference voltage at a negative terminal of the voltage comparator block and is operable to produce a logic output based upon a favorable comparison. The hysteresis logic block is operable to produce one of a plurality of reference voltage levels to the negative terminal of the voltage comparator block as the selected reference voltage based upon a two-level reference signal input and further based upon a detected transition in logic of an output produced by the voltage comparator block wherein the output is received by the hysteresis logic block in a feedback signal.

16 Claims, 7 Drawing Sheets voltage comparator block 150 voltage comparator block 180

PRECISE DYNAMIC HYSTERESIS

CROSS-REFERENCE TO RELATED APPLICATION

This application claims priority to and incorporates by reference U.S. Provisional Application entitled, "Precise Dynamic Hysteresis", having a Ser. No. 60/718,543 and a filing date of Sep. 19, 2005.

BACKGROUND

1. Technical Field

The present invention relates to wireless communications and, more particularly, to circuitry for switching logic.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMIS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bipolar circuitry, allowing for large signal swings and linear transmitter component behavior. Therefore, many legacy baseband processors employ analog interfaces that communicate analog signals to and from the radio processor.

Within such communication systems and, more generally, within logic circuits and other operational circuits, switching often occurs in response to a signal level reaching a specified threshold. One known problem, however, is that the signal may oscillate about the threshold point causing the circuit output to fluctuate.

FIG. 1 is a functional block diagram of a prior art circuit for rendering a threshold crossing decision. As may be seen, a signal source produces a signal to a threshold comparator that is further coupled to receive a reference voltage $V_{ref}$. The threshold comparator is operable to provide a first logic output if the signal from the signal source exceeds the reference voltage $V_{ref}$ and a second logic output if the signal does not exceed the reference voltage $V_{ref}$. As may be seen, fluctuations of the signal received from the signal source due to noise may result in a fluctuating output if the signal and the reference voltage $V_{ref}$ are substantially similar.

In a circuit in which such voltage levels are small, comparators are often used to resolve the polarity of the difference between two voltages and to amplify the very small voltage differences to make a decision. In many cases, noise on the voltages being resolved can cause fluctuations, as shown in FIG. 1. It is desirable, therefore, to make hard decisions that do not toggle due to noise variations. Thus, a hysteresis circuit using a comparator with cross coupled gain devices is sometimes employed wherein positive feedback generates the desired hysteresis to prevent such fluctuating outputs. One problem with these known approaches, however, is that process variations contribute to variations in the effective hysteresis voltage such that a large variation in hysteresis voltages may be experienced. What is needed, therefore, is a hysteresis circuit that is operable to quickly respond to a short or low output impedance situation to reduce the likelihood of damaging the integrated circuit and that reduces any required settle time when transitioning back to a normal mode of operation.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
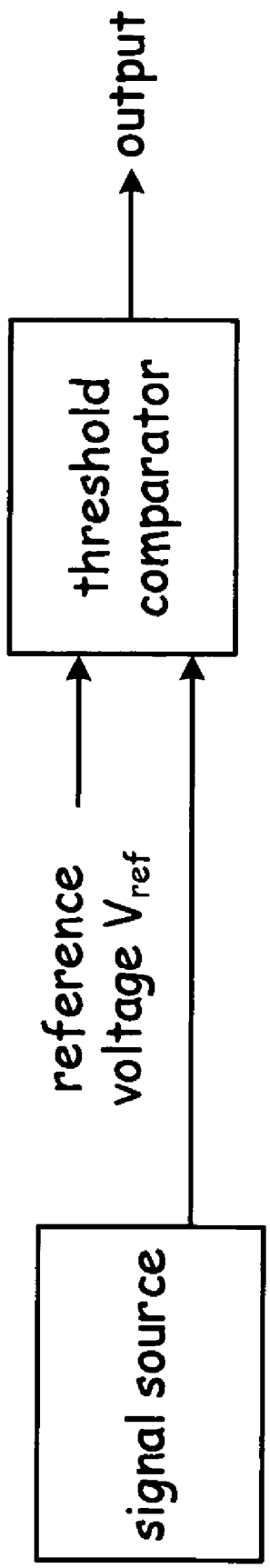
FIG. 1 is a functional block diagram of a prior art circuit for rendering a threshold crossing decision.
Figure 2:
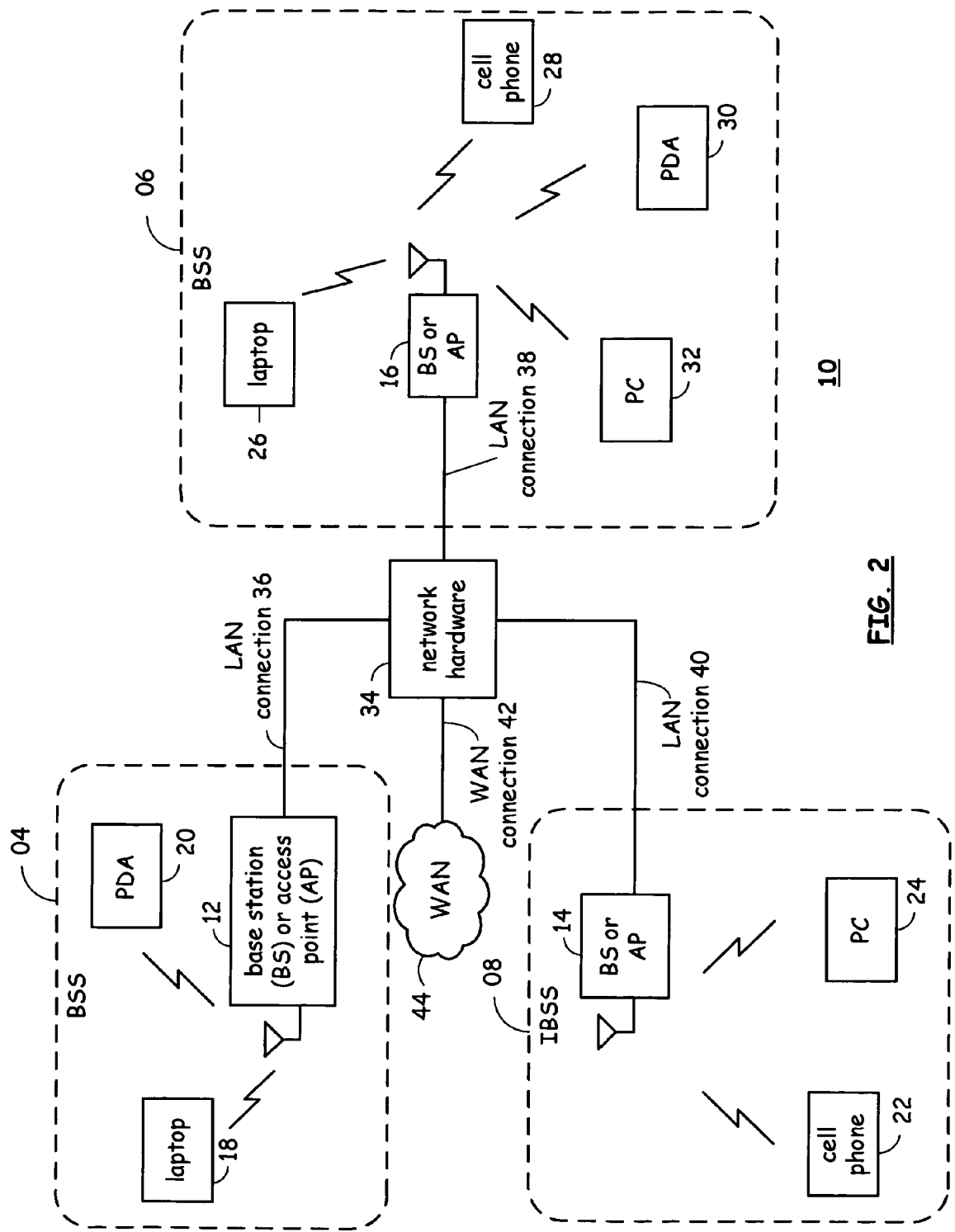
FIG. 2 is a functional block diagram illustrating a communication system that includes circuit devices and network elements and operation thereof according to one embodiment of the invention.

FIG. 2 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 4-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 3:
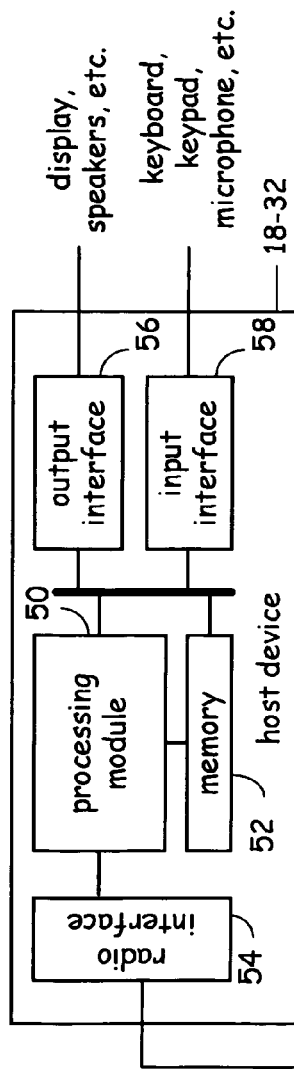
FIG. 3 is a schematic block diagram illustrating a wireless communication host device and an associated radio.
Figure 3:
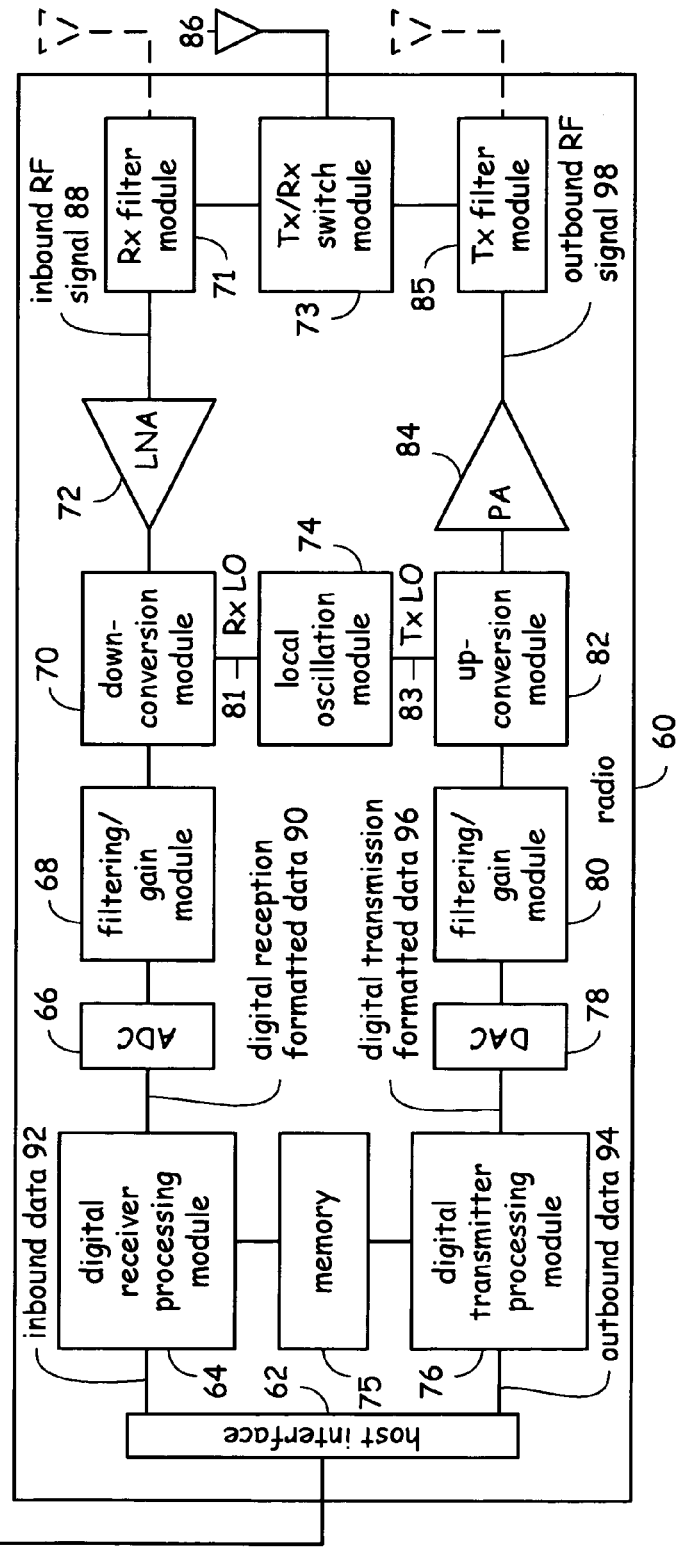

FIG. 3 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 3 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 4:
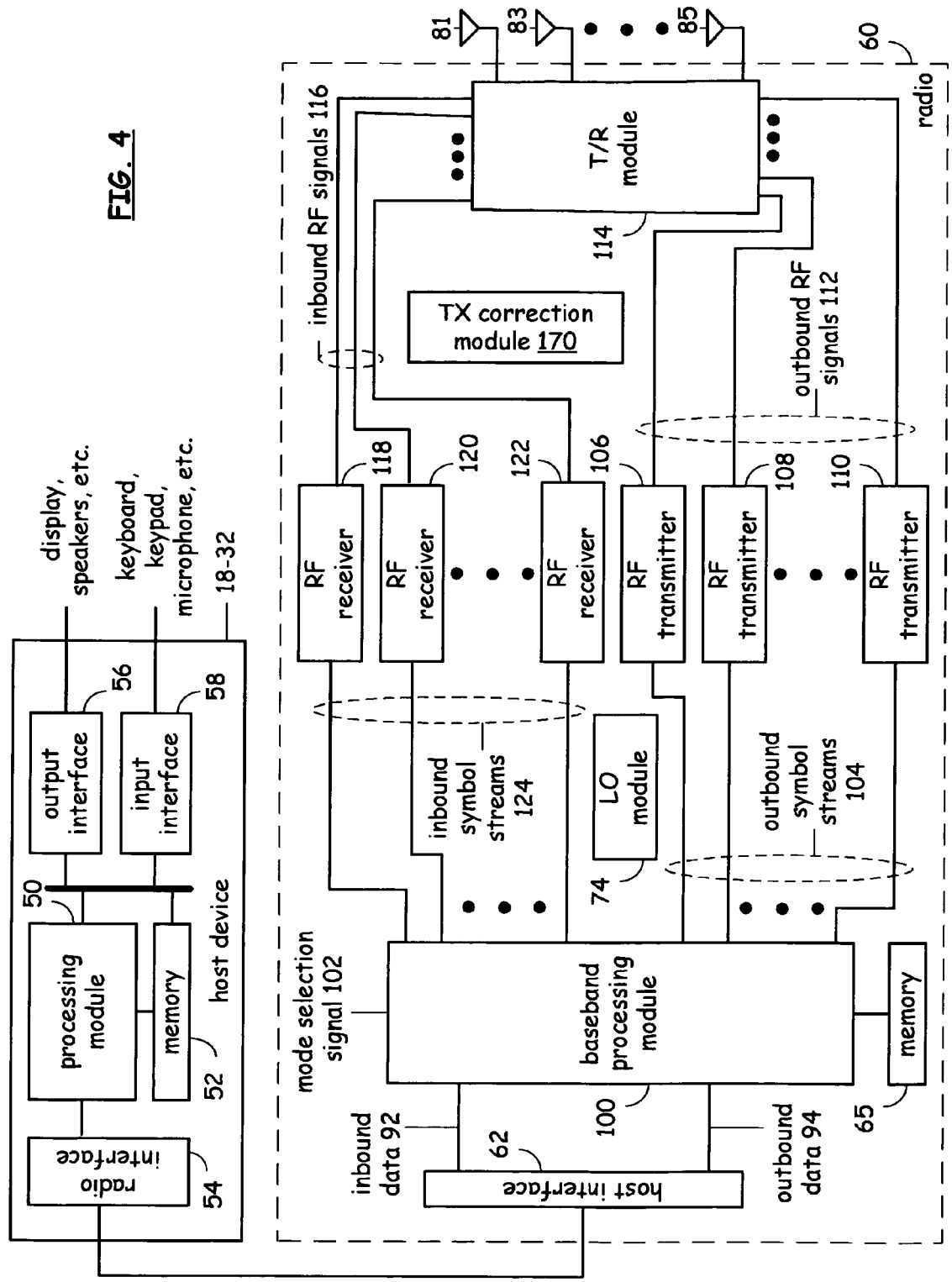
FIG. 4 is a schematic block diagram illustrating a wireless communication device that includes the host device and an associated radio.

FIG. 4 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 4 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 5:
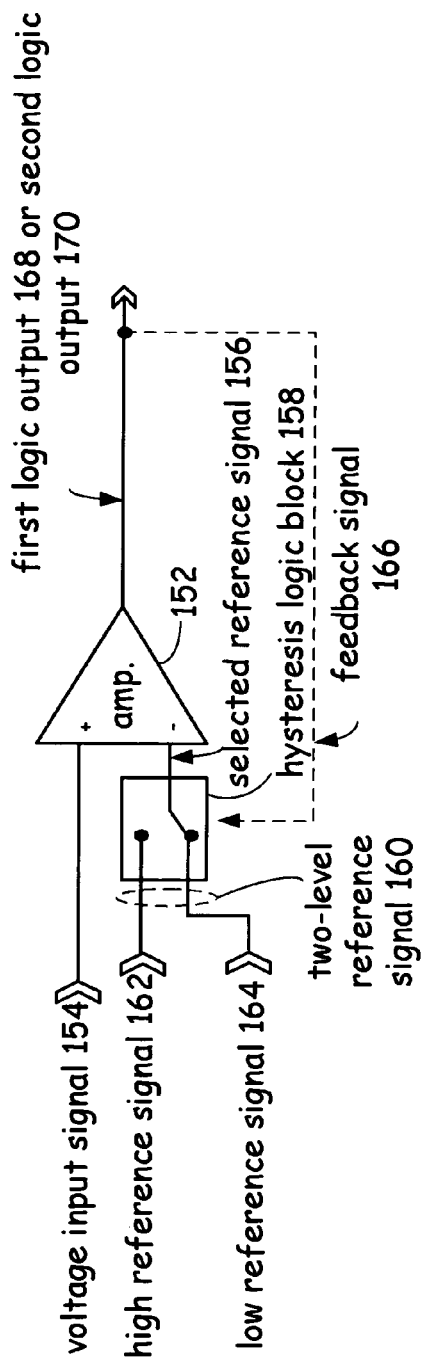
FIG. 5 is a functional schematic diagram of one embodiment of the invention of a voltage comparator block for providing hysteresis.

FIG. 5 is a functional schematic diagram of one embodiment of the invention of a voltage comparator block for providing hysteresis. Specifically, a voltage comparator block 150 includes an amplifier 152 that is operably disposed to receive a voltage input signal 154 and a selected reference signal 156. The selected reference signal 156 is produced by a hysteresis logic block 158. Hysteresis logic block 158 is operably disposed to receive a two-level reference signal 160 that further includes a high reference signal 162 and a low reference signal 164. Hysteresis logic block 158 further receives a feedback signal 166 that comprises either a first logic output 168 or a second logic output 170 produced by amplifier 152. Hysteresis logic block 158 is operable to select between the high reference signal 162 and the low reference signal 164 of the two-level reference signal 160 based upon detected transitions between first logic output 168 and second logic output 170 received as feedback signal 166.

As may be seen, therefore, the voltage comparator block 150 with associated hysteresis logic comprising hysteresis logic block 158 is operably disposed to receive a voltage input signal at a positive terminal of the amplifier 152 and a selected reference voltage at a negative terminal of the voltage comparator block and operable to produce a logic output based upon a favorable comparison. The hysteresis logic block 158 is operable to produce one of a plurality of reference voltage levels to the negative terminal of the amplifier 152 as the selected reference signal based upon a two-level reference signal input and further based upon a detected transition in logic of an output produced by the amplifier 152 wherein the output is received by the hysteresis logic block in feedback signal 166.

Generally, the voltage comparator block 150 with associated hysteresis logic is initially operable to produce a first logic output 168 based upon a favorable comparison between the voltage input signal 154 and a lower level of the two-level reference signal and a second logic output 170 based upon an unfavorable comparison between the voltage logic signal and the lower level of the two-level reference signal. Further, upon transitioning from the first logic output 168 to the second logic output 170, the voltage comparator block 150 with associated hysteresis logic is operable to produce the second logic output 170 based upon an unfavorable comparison between the voltage logic signal and a higher level of the two-level reference signal and the first logic output 168 based upon a favorable comparison between the voltage logic signal and the higher level of the two-level reference signal. The two-level reference signal includes a high reference voltage and a low reference voltage that may comprise two independently generated voltage signals or, alternatively, a reference voltage and the reference voltage reduced by a specified amount. For example, in one embodiment, the specified amount is determined by a voltage drop across a MOSFET device or a resistive device. In another embodiment, the reference voltage comprises the lower level voltage, and the higher level voltage is based upon the lower level voltage summed with an additional voltage required to generate a specified current to effectively switch a MOSFET device out of effective coupling.

Figure 6:
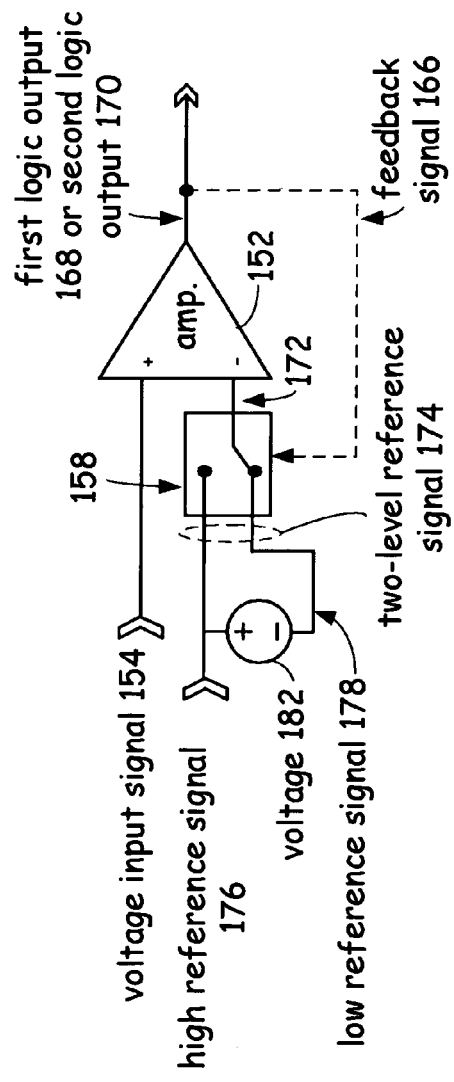
FIG. 6 is a functional schematic diagram of one alternate embodiment of the invention of a voltage comparator block.

FIG. 6 is a functional schematic diagram of one alternate embodiment of the invention of a voltage comparator block. Specifically, a voltage comparator block 180 includes an amplifier 152 that is operably disposed to receive a voltage input signal 154 and a selected reference signal 172. The selected reference signal 172 is produced by a hysteresis logic block 158. Hysteresis logic block 158 is operably disposed to receive a two-level reference signal 174 that further includes a high reference signal 176 and a low reference signal 178. Hysteresis logic block 158 further receives a feedback signal 166 that comprises either a first logic output 168 or a second logic output 170 produced by amplifier 152. Hysteresis logic block 158 is operable to select between the high reference signal 176 and the low reference signal 178 of the two-level reference signal 174 based upon detected transitions between first logic output 168 and second logic output 170 received as feedback signal 166. Here, the difference between the high reference signal 176 and the low reference signal 178 is generated by a voltage 182. Voltage 182 may be generated by a specified voltage source summed with the low reference signal 178 or, alternatively, may be generated by subtracting a specified voltage drop from high reference signal 176. For example, the voltage drop may be generated by a gate-to-source MOSFET threshold voltage drop.

Figure 7:
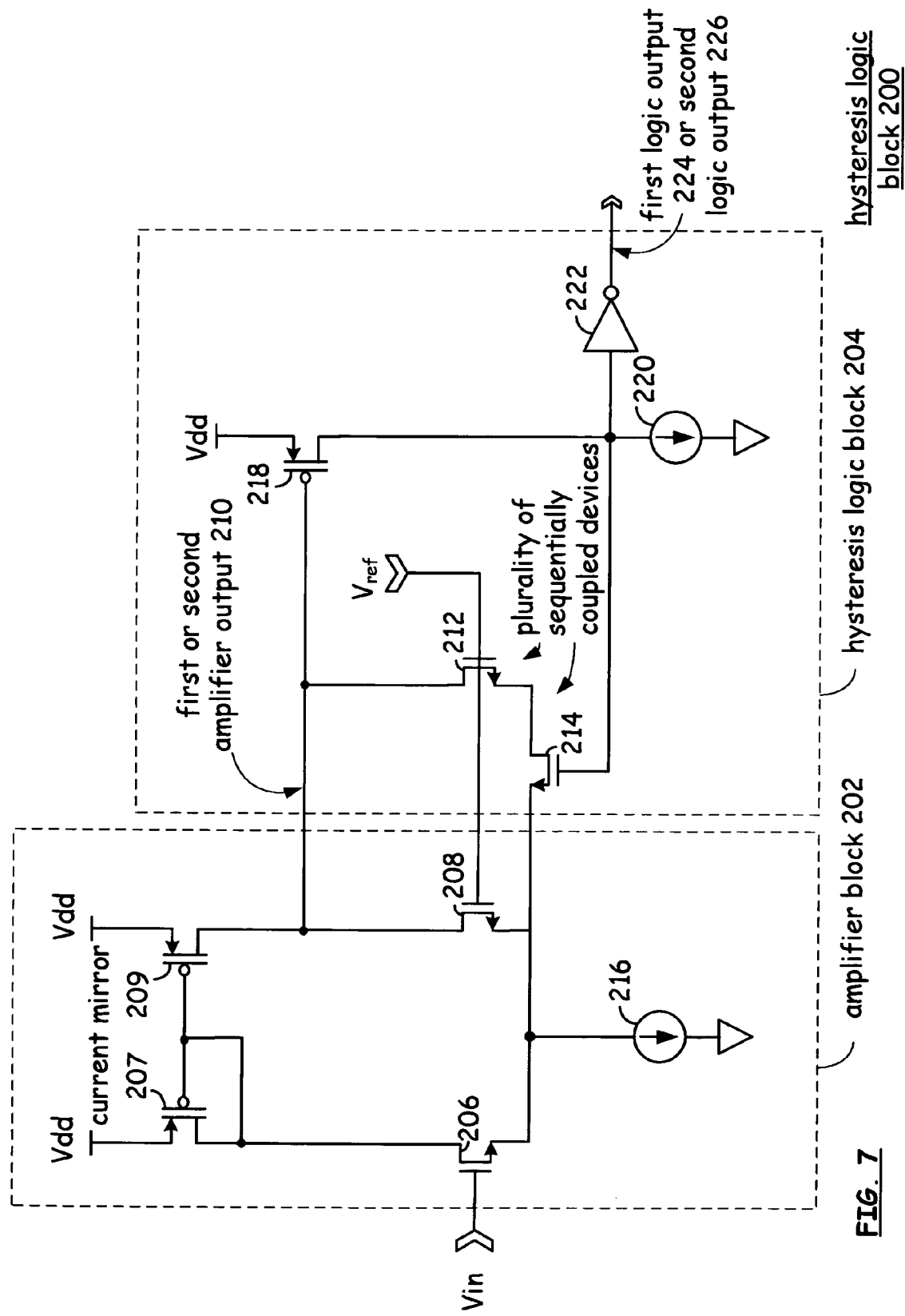
FIG. 7 is a functional schematic diagram of a hysteresis logic block according to one embodiment of the invention.

FIG. 7 is a functional schematic diagram of a hysteresis logic block according to one embodiment of the invention. The hysteresis logic block 200 of FIG. 7 includes an amplifier block 202 and a hysteresis logic block 204. The amplifier block 202 includes first and second input devices 206 and 208, respectively. The amplifier block 202 is operably disposed to receive an input voltage signal Vin at the first input device 206 and a reference voltage $V_{ref}$ at the second input device 208 and operable to produce either a first amplifier output or a second amplifier output 210 at an amplifier block output based upon the input voltage signal Vin comparing favorably with the reference voltage $V_{ref}$. Disposed between a supply Vdd and MOSFETs 206 and 208 is a current supply further including MOSFETs 207 and 209. Current conducted through MOSFET 207 based upon the input voltage signal Vin is replicated through MOSFET 209 (presuming MOSFET 208 has sufficient bias). Hysteresis logic block 204 is operably disposed to receive the first or second amplifier output 210 and is operable to produce a first logic output 224 as long as the voltage signal compares favorably with the reference voltage $V_{ref}$ and, upon transitioning from the first logic output to a second logic output 226, to produce the second logic output 226 as long as the input voltage does not compare favorably with a sum of the reference voltage $V_{ref}$ and an offset voltage. The offset voltage is equal to a gate voltage necessary to match a drain current of first input device 206 coupled to the first input with a drain current for a device twice the size of the first input device, as will be explained in greater detail below.

The hysteresis logic block 204 includes a pair of MOSFET devices 212 and 214, respectively, in the described embodiment, having sequentially coupled channels operably disposed to define a current path from the amplifier block 202 output and a biasing current source 216 operably disposed to provide a bias current for the amplifier block 202. A gate terminal of a first device 212 of the pair of devices is operably disposed to receive a reference voltage. A gate terminal of the first device 212 of the pair of devices is operably disposed to receive the reference voltage and is further coupled to a gate terminal of the second input device 208 of the amplifier block 202. A source terminal of a second device 214 of the pair of devices is operably coupled to provide current to the biasing current source 216 and is also coupled to source terminals of the first and second input devices 206 and 208 of the amplifier block. In operation, the drain current of the first input device must compare favorably to a drain current of the pair of devices 212 and 214 having sequentially coupled channels for device 214 to turn off, thereby rendering device 212 ineffective and electrically eliminating the current path created by devices 212 and 214.

As may further be seen, the hysteresis logic block 204 further includes an inverting p-channel output device 218 having a source channel operably disposed to provide an output signal to an output bias current sink 220 and an inverting buffer 222 and having a gate terminal operably disposed to receive the first or second logic output produced at the amplifier block output. Thus, if Vin is initially greater than $V_{ref}$, the output of the hysteresis logic block 204 produced by inverting buffer 222 is equal to Vdd. During this state of operation, device 214 is off and device 212 is ineffective since it does not have a circuit path to a current sink or circuit common from its source terminal (if device is an n-channel device as shown in the exemplary embodiment of FIG. 7). When Vin drops below $V_{ref}$, the output of inverting buffer 222 goes to 0 volts and devices 214 and 212 become enabled. Because these devices are now enabled in this state of operation, Vin must exceed the sum of $V_{ref}$ and Vdelta to toggle hysteresis logic block operation back to the initially described state and to toggle the output of inverting buffer 222 to Vdd. In this embodiment, Vdelta is equal to the gate voltage necessary to match the drain current of the input device 206 with a device twice its size (because of devices 212 and 214). For this example, devices 206, 212 and 214 are substantially equal in device sizing and performance. The voltage required to toggle the output, more generally, may be adjusted by changing device sizing and current bias control. Generally, because devices 206, 208 and 214 are matched, process variations are rendered relatively inconsequential and a relatively constant Vdelta is defined for toggling purposes to provide a constant hysteresis that is operable upon a dynamically changing input signal.

Figure 8:
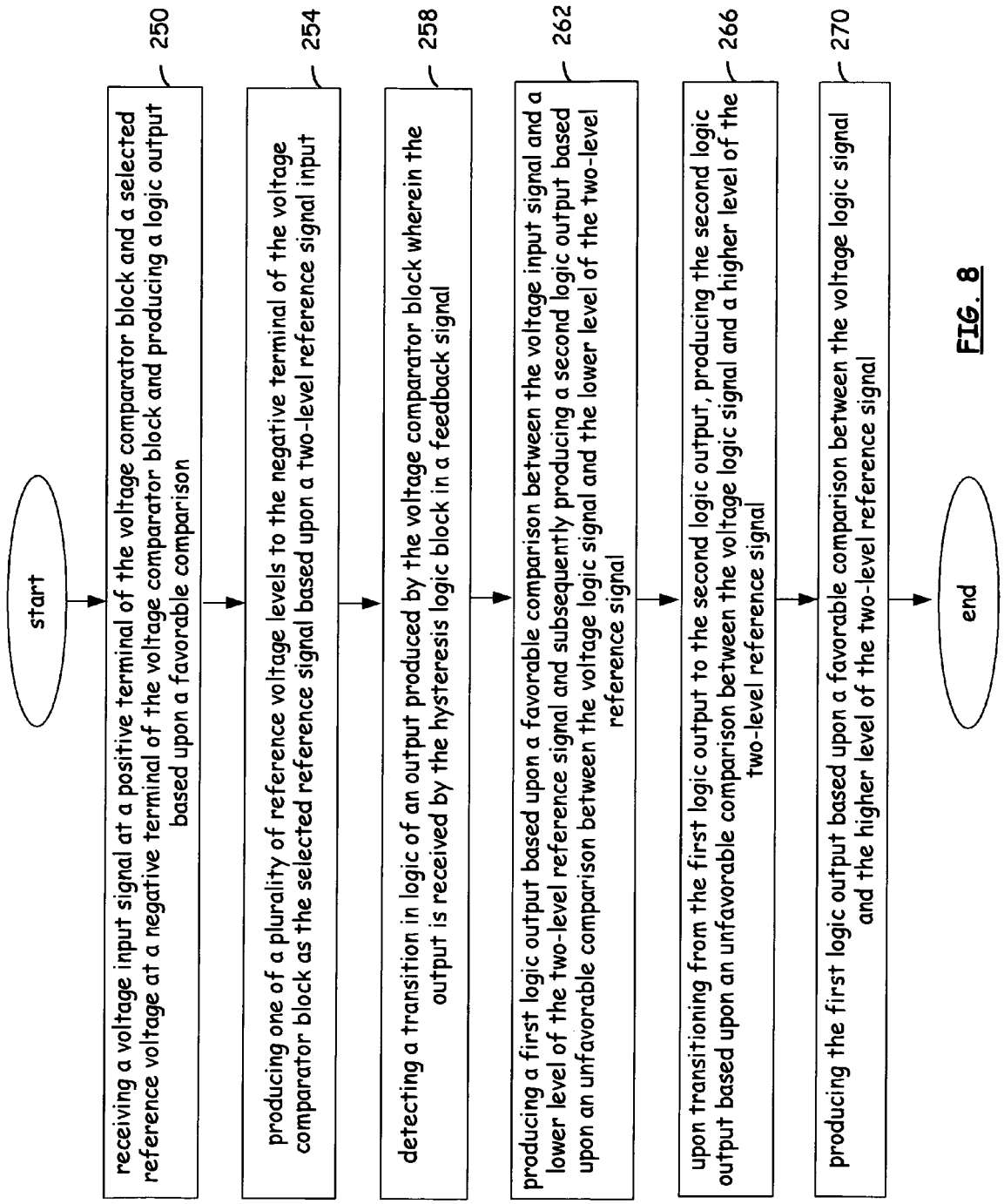
FIG. 8 is a flow chart illustrating a method according to one embodiment of the invention.

FIG. 8 is a flow chart illustrating a method according to one embodiment of the invention. Initially the method includes receiving a voltage input signal at a positive terminal of the voltage comparator block and a selected reference voltage at a negative terminal of the voltage comparator block and producing a logic output based upon a favorable comparison (step 250). Thereafter, the method includes producing one of a plurality of reference voltage levels to the negative terminal of the voltage comparator block as the selected reference signal based upon a two-level reference signal input (step 254). Whenever an unfavorable condition first occurs affecting a change in the output, the method includes detecting a transition in logic of an output produced by the voltage comparator block wherein the output is received by the hysteresis logic block in a feedback signal (step 258). Thus, the method includes producing a first logic output based upon a favorable comparison between the voltage input signal and a lower level of the two-level reference signal and subsequently producing a second logic output based upon an unfavorable comparison between the voltage logic signal and the lower level of the two-level reference signal (step 262). Thereafter, upon transitioning from the first logic output to the second logic output, the method includes producing the second logic output based upon an unfavorable comparison between the voltage logic signal and a higher level of the two-level reference signal (step 266). Thereafter, the method includes producing the first logic output based upon a favorable comparison between the voltage logic signal and the higher level of the two-level reference signal (step 270). In one embodiment; the higher level of the two-level reference signal is equal to the lower level summed with a specified voltage. In another embodiment, the lower level of the two-level reference signal is equal to the higher reference signal less a voltage drop across a specified device. Generally, in one embodiment, and upon transitioning from the first logic output to the second logic output, the method includes operably disposing a plurality of sequentially coupled devices to require an input signal level to rise to a level that causes current in the sequentially coupled devices to exceed a current level of an input device in order to electrically remove the plurality of sequentially coupled devices.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit radio transceiver, comprising:
   a baseband processor operable to process ingoing digital communication signals and to produce outgoing digital communication signals;
   a transmitter front end operable to process and transmit outgoing RF signals based upon the outgoing digital communication signals;
   a receiver front end operable to receive ingoing RF signals and to process the ingoing RF signals to produce the ingoing digital communication signals to the baseband processor; and
   an analog comparator circuit with associated hysteresis logic operably disposed to provide a logic switching mechanism based upon an input voltage level to at least one of the transmitter front end, the receiver front end and the baseband processor, the analog comparator circuit with associated hysteresis logic further including:
      a voltage comparator block operably disposed to receive a voltage input signal at a positive terminal of the voltage comparator block and a selected reference voltage at a negative terminal of the voltage comparator block and operable to produce a logic output based upon a favorable comparison;
      a hysteresis logic block operable to produce one of a plurality of reference voltage levels to the negative terminal of the voltage comparator block as the selected reference voltage based upon a two-level reference signal input and further based upon a detected transition in logic of an output produced by the voltage comparator block wherein the output is received by the hysteresis logic block in a feedback signal; and
      wherein the analog comparator circuit with associated hysteresis logic is operable to produce a first logic output based upon a favorable comparison between the voltage input signal and a lower level of the two-level reference signal input and a second logic output based upon an unfavorable comparison between the voltage input signal and the lower level of the two-level reference signal.

2. The integrated circuit transceiver of claim 1 wherein, upon transitioning from the first logic output to the second logic output, the analog comparator circuit with associated hysteresis logic is operable to produce the second logic output based upon an unfavorable comparison between the voltage input signal and a higher level of the two-level reference signal input and the first logic output based upon a favorable comparison between the voltage input signal and the higher level of the two-level reference signal input.

3. The integrated circuit transceiver of claim 1 wherein the two-level reference signal input comprises a high reference voltage and a low reference voltage.

4. The integrated circuit transceiver of claim 1 wherein the two-level reference signal input comprises a reference voltage and a reference voltage reduced by a specified amount.

5. The integrated circuit transceiver of claim 4 wherein the specified amount is determined by a threshold voltage drop across a MOSFET device.

6. The integrated circuit transceiver of claim 4 wherein the specified amount is determined by a voltage drop across a resistive device.

7. An analog comparator circuit with associated hysteresis logic, comprising:
   a voltage comparator block operably disposed to receive a voltage input signal at a positive terminal of the voltage comparator block and a selected reference voltage at a negative terminal of the voltage comparator block and operable to produce a logic output based upon a favorable comparison;
   a hysteresis logic block operable to produce one of a plurality of reference voltage levels to the negative terminal of the voltage comparator block as the selected reference voltage based upon a two-level reference signal input and further based upon a detected transition in logic of an output produced by the voltage comparator block wherein the output is received by the hysteresis logic block in a feedback signal; and wherein the analog comparator circuit with associated hysteresis logic is operable to produce a first logic output based upon an unfavorable comparison between the voltage input signal and a higher level of the two-level reference signal input and a second logic output based upon a favorable comparison between the voltage input signal and a higher level of the two-level reference signal.

8. The analog comparator circuit with associated hysteresis logic of claim 7 wherein, upon transitioning from the first logic output to the second logic output, the analog comparator circuit with associated hysteresis logic is operable to produce the logic output based upon an unfavorable comparison between the voltage input signal and a lower level of the two-level reference signal and a second logic output based upon a favorable comparison between the voltage input signal and a lower level of the two-level reference signal.

9. The analog comparator circuit with associated hysteresis logic of claim 7 wherein the two-level reference signal comprises a high reference voltage and a low reference voltage.

10. The analog comparator circuit with associated hysteresis logic of claim 7 wherein the two-level reference signal comprises a reference voltage and a reference voltage reduced by a specified amount.

11. The analog comparator circuit with associated hysteresis logic claim 10 wherein the specified amount is determined by a threshold voltage drop across a MOSFET device.

12. The analog comparator circuit with associated hysteresis logic of claim 10 wherein the specified amount is determined by a voltage drop across a resistive device.

13. A method for providing hysteresis, comprises the steps of:

receiving a voltage input signal at a positive terminal of a voltage comparator block and a selected reference voltage at a negative terminal of the voltage comparator block and producing a logic output based upon a favorable comparison;

producing one of a plurality of reference voltage levels to the negative terminal of the voltage comparator block as the selected reference voltage based upon a two-level reference signal input and detecting a transition in logic of an output produced by the voltage comparator block wherein the output is received by a hysteresis logic block in a feedback signal; and producing a first logic output based upon a favorable comparison between the voltage input signal and a lower level of the two-level reference signal and subsequently producing a second logic output based upon an unfavorable comparison between the voltage input signal and the lower level of the two-level reference signal.

14. The method of claim 13 wherein, upon transitioning from the first logic output to the second logic output, producing the second logic output based upon an unfavorable comparison between the voltage input signal and a higher level of the two-level reference signal and producing the first logic output based upon a favorable comparison between the voltage input signal and the higher level of the two-level reference signal.

15. The method of claim 14 wherein the higher level of the two-level reference signal is equal to the lower level summed with a specified voltage.

16. The method of claim 14 further including, upon transitioning from the first logic output to the second logic output, operably disposing a plurality of sequentially coupled devices to cause an input signal level to rise to a level that causes current in the sequentially coupled devices to exceed a current level of an input device.

* * * * *